United States Patent
Gambee

(10) Patent No.: US 10,332,792 B1
(45) Date of Patent: Jun. 25, 2019

(54) METHODS OF FABRICATING CONDUCTIVE TRACES AND RESULTING STRUCTURES

(71) Applicant: Micron Technology, Inc., Boise, ID (US)

(72) Inventor: Christopher J. Gambee, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/841,660

(22) Filed: Dec. 14, 2017

(51) Int. Cl.
*H01L 21/44* (2006.01)
*H01L 21/768* (2006.01)
*H01L 23/532* (2006.01)
*H01L 23/00* (2006.01)

(52) U.S. Cl.
CPC .. *H01L 21/76865* (2013.01); *H01L 21/76873* (2013.01); *H01L 23/53238* (2013.01); *H01L 24/17* (2013.01); *H01L 2224/0231* (2013.01); *H01L 2224/0239* (2013.01); *H01L 2924/3011* (2013.01)

(58) Field of Classification Search
CPC ......... H01L 21/76865; H01L 21/76873; H01L 23/53238
USPC ....................................................... 438/653
See application file for complete search history.

(56) References Cited

U.S. PATENT DOCUMENTS

| 6,477,031 | B1 | 11/2002 | Hayashi |
| 7,235,148 | B2 | 6/2007 | Day et al. |
| 7,268,075 | B2 | 9/2007 | Gracias et al. |
| 7,589,426 | B2 | 9/2009 | Jiang et al. |
| 7,709,956 | B2 * | 5/2010 | Naem ............... H01L 21/76852 257/211 |
| 8,168,891 | B1 | 5/2012 | Goergen et al. |
| 9,583,462 | B2 * | 2/2017 | Lee ......................... H01L 24/19 |
| 9,620,468 | B2 * | 4/2017 | Lin .......................... H01L 24/13 |
| 2008/0142249 | A1 | 6/2008 | Chamberlin et al. |
| 2011/0101523 | A1 * | 5/2011 | Hwang ................... H01L 24/11 257/737 |
| 2014/0027922 | A1 | 1/2014 | Uzoh |
| 2014/0186651 | A1 | 7/2014 | Han et al. |
| 2016/0379946 | A1 * | 12/2016 | Maekawa .............. H01L 24/06 257/773 |

OTHER PUBLICATIONS

Olney, Barry, Effects of Surface Roughness on High-Speed PCBs, www.icd.com.au, The PCB Magazine, Feb. 2015, pp. 22-27.

* cited by examiner

*Primary Examiner* — Luan C Thai
(74) *Attorney, Agent, or Firm* — TraskBritt

(57) ABSTRACT

A method of forming conductive traces comprises forming a seed material over a surface of a substrate, forming a patterned mask material over the seed material to define trenches leaving portions of the seed material within the trenches exposed, and depositing a conductive material over the exposed seed material in the trenches to form conductive traces. At least a portion of the patterned mask material is removed, a barrier formed over side surfaces and upper surfaces of the conductive traces, and exposed portions of the seed material are removed. Conductive traces and structures incorporating conductive traces are also disclosed.

22 Claims, 5 Drawing Sheets

METHODS OF FABRICATING CONDUCTIVE TRACES AND RESULTING STRUCTURES

TECHNICAL FIELD

Embodiments disclosed herein relate to methods for fabricating conductive traces and conductive traces so formed. More specifically, embodiments disclosed herein relate to methods for fabricating conductive traces for high frequency signal transmission and resulting structures, including without limitation a redistribution layer (RDL) incorporating such conductive traces and assemblies including such RDLs.

BACKGROUND

The semiconductor industry has, over the years, migrated to the use of copper for conductive traces, which metal offers lower electrical resistance, and thus signal impedance, than prior materials such as aluminum or aluminum alloys. This trend has been enhanced by the industry employing ever-higher frequency signals to accommodate faster switching speeds in electrical circuits, in order to maintain power consumption at a reasonable level.

One phenomenon associated with the use of copper traces, which is negligible at lower frequencies but which becomes significant at frequencies around 1 GHz and above, is the so-called "skin effect" responsive to the surface finish exhibited by the copper trace. As frequency increases, the skin effect drives the current into the surface of the copper, dramatically increasing power loss and reducing signal speed with increasing roughness of the surface finish. This is due to the effective length of the conductor increasing as the current follows along a rough surface topography of the copper. Thus, at high frequencies, the effective impedance of the copper increases as a function of the increased distance the current must traverse over the rough copper surface.

Conventional methods of fabricating conductive traces, such as for RDLs, involve depositing a blanket seed layer on a substrate, followed by depositing and patterning a photoresist, electroplating copper to form traces in the trenches in the photoresist, and then stripping the photoresist from the substrate to expose the seed layer, which is then etched.

The conventional fabrication process is illustrated in FIGS. 1A through 1E. In FIG. 1A, a substrate 100 has a seed layer 102 of a metal deposited, for example, as by physical vapor deposition (i.e., sputtering), to serve as an adhesion layer and as an electrode for subsequent electroplating of metal thereon. In FIG. 1B, a layer of photoresist 104 is deposited on seed layer 102, after which the photoresist is patterned, developed and portions of the photoresist 104 removed to form trenches 106. In FIG. 1C, copper is electroplated over the portions of seed layer 102 exposed in the trenches 106 to form conductive traces 108. The photoresist 104 is then removed, exposing conductive traces 108 which exhibit smooth surfaces S from the electroplating process as shown in FIG. 1D. However, as also shown in FIG. 1D, the portion of seed layer 102 previously covered by patterned photoresist 104 is now exposed, necessitating removal to avoid electrical shorting between adjacent conductive traces 108. When seed layer 102 is removed by wet etching as shown in FIG. 1E, the surfaces of the electroplated conductive traces 108 are also etched, resulting in rough surfaces R, increasing conductive trace impedance. As a result, high frequency signal transmission is impaired due to the skin effect, resulting in signal losses and requiring additional power to maintain signal speed.

DETAILED DESCRIPTION

Figure 1A:
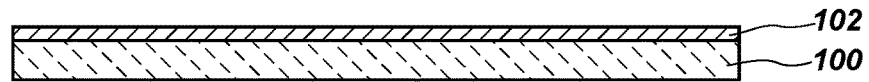
FIGS. 1A through 1E schematically depict a conventional process flow for fabrication of conductive traces on a substrate.
Figure 1B:
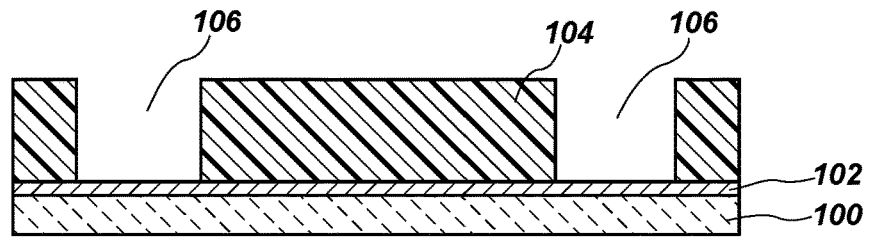
Figure 1C:
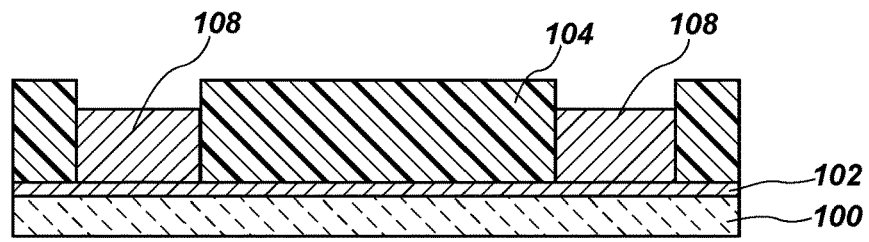
Figure 1D:
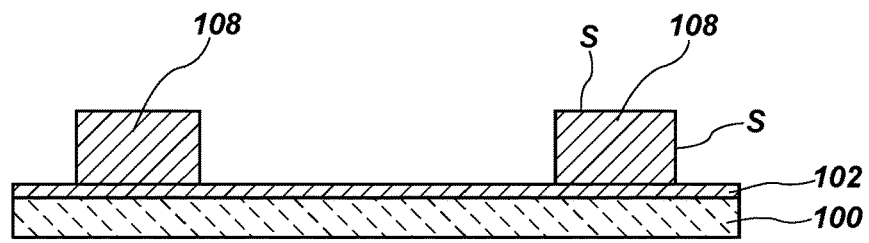
Figure 1E:
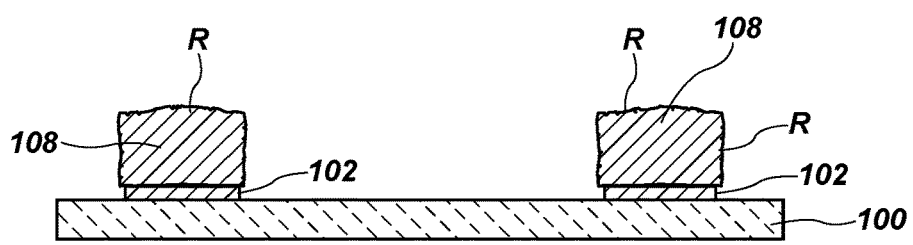

Embodiments of the disclosure comprise methods of forming conductive traces exhibiting smooth surface finishes. Conductive traces so formed substantially eliminate the skin effect and exhibit reduced impedance when transmitting high frequency signals, enhancing signal transmission speed without increasing power requirements.

The following description provides specific details, such as sizes, shapes, material compositions, and orientations in order to provide a thorough description of embodiments of the disclosure. However, a person of ordinary skill in the art would understand that the embodiments of the disclosure may be practiced without necessarily employing these specific details. Embodiments of the disclosure may be practiced in conjunction with conventional fabrication techniques employed in the industry. In addition, the description provided below does not form a complete process flow for manufacturing an RDL or other electronic structure including conductive traces, such a structure including conductive traces, or assemblies including structures incorporating conductive traces. Only those process acts and structures necessary to understand the embodiments of the disclosure are described in detail below. Additional acts to form a complete structure including conductive traces, or a complete assembly including structures incorporating conductive traces as described herein may be performed by conventional fabrication processes.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof. As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" in reference to a given parameter is inclusive of the stated value and has the meaning dictated by the context (e.g., it includes the degree of error associated with measurement of the given parameter).

As used herein, the term "smooth" as applied to characterize a surface finish of a conductive trace, means and includes a surface finish exhibiting a topography variation, as measured using atomic force microscopy, of no more than about 2 nanometers (nm) RMS. Stated another way, a smooth surface will, to the observer, exhibit a mirror finish.

As used herein the term "layer" means and includes a level, film or coating of material residing on a structure, which level may be continuous or discontinuous between portions of the material, and which may be conformal or non-conformal, unless otherwise indicated.

Referring to FIGS. 2A through 2G, a process flow for forming conductive traces according to embodiments of the disclosure will be described.

Figure 2A:
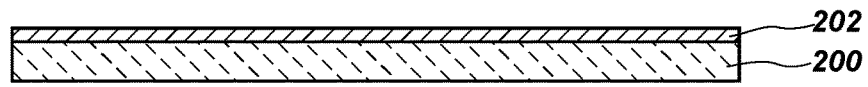
FIGS. 2A through 2G schematically depict a process flow according to embodiments of the disclosure for fabrication of conductive traces on a substrate.

Referring to FIG. 2A, a substrate 200 may comprise a dielectric disposed over existing structures, for example, a semiconductor structure (e.g., wafer, wafer segment or semiconductor dice), on a semiconductor structure, on a ceramic, a glass or another carrier substrate. For example, in some embodiments, the substrate 200 may comprise an array of semiconductor dice (e.g., memory dice) and the traces to be formed thereon will comprise part of an RDL associated with each die. In other embodiments, the substrate may comprise a sacrificial substrate on which multiple RDLs are formed, and subsequently singulated and removed for use in fabrication of, for example, fan out package (FOP) assemblies. Substrate 200 has a seed material 202, which may be characterized as a layer, of one or more metals deposited thereon, for example, as by physical vapor deposition, also known as "sputtering." In one embodiment, substrate 200 may comprise a glass wafer bearing an organic polymer formulated for subsequent release of a structure or structures bearing conductive traces formed thereon by exposure to a laser through the glass. Seed material 202 may comprise a single layer of copper, or may be a bi-layer and comprise a first-deposited layer of, for example, titanium followed by a second layer of copper. The titanium may act to enhance adherence of the to-be-formed conductive traces, as well as a barrier with respect to substrate 200. Seed material 202 may be formed, for example, to a thickness of about 2000 Å.

Figure 2B:
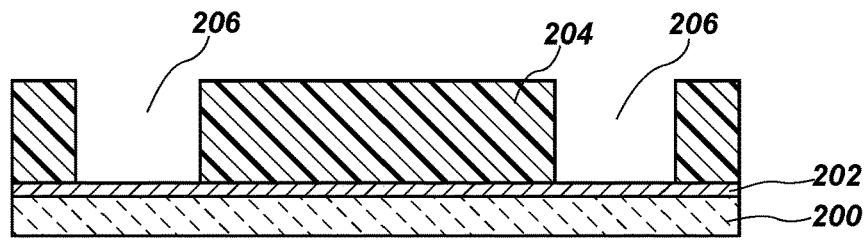

Referring to FIG. 2B, a layer of mask material, for example a positive or negative photoresist 204, is deposited on seed material 202, for example by spin-coating or spray-coating. In one embodiment, a positive photoresist is employed, as (in comparison to negative photoresists) step coverage is superior, smaller feature size may be achieved and an aqueous developer base may be employed. The photoresist 204 is photolithographically patterned and developed by conventional techniques, and undeveloped portions of the photoresist 204 removed to form trenches 206 exposing portions of seed material 202.

Figure 2C:
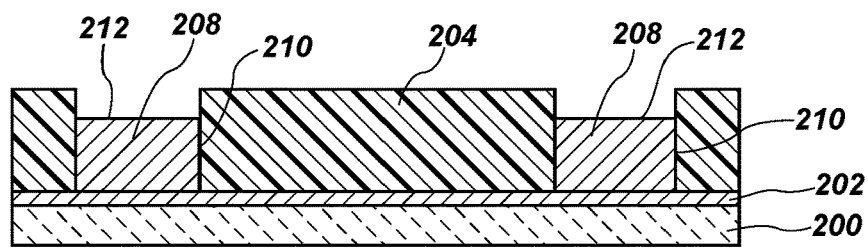

Referring to FIG. 2C, elemental copper is electroplated, the process also being characterized in the art as electrochemical deposition (ECD) over the portions of the copper of seed material 202 exposed in the trenches 206 to form conductive traces 208, which may also be characterized as trace cores, exhibiting smooth side surfaces 210 and upper surfaces 212. By way of example only, conductive traces 208 may be of a height of about 2 μm, and of a width from about 2 µm to about 100 µm, widths toward the upper end of the range being more suitable for power transmission. As formed, the side surfaces 210 and upper surfaces 212 exhibit a topography variation of no more than about 2 nanometers (nm) RMS. Characterized another way, the surfaces exhibit a mirror finish.

Figure 2D:
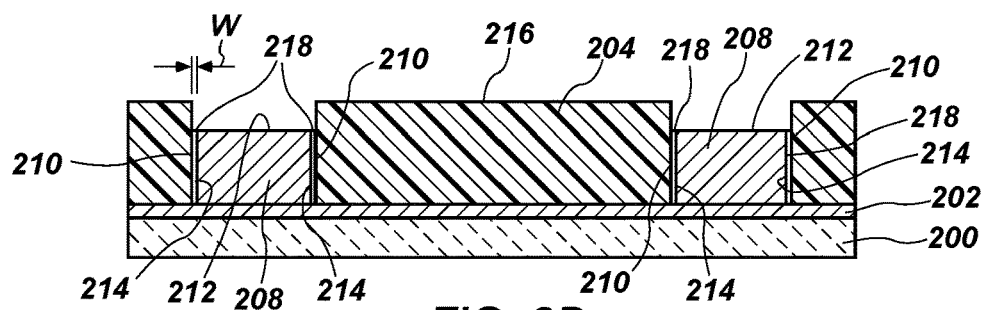

Referring to FIG. 2D, remaining portions of photoresist 204 are dry (i.e., reactive ion) etched to remove a depth of the photoresist material from side surfaces 214 and upper surfaces 216 thereof, incidentally reducing a height of the photoresist 204, but more significantly creating gaps 218 between side surfaces 210 of conductive traces 208 and adjacent side surfaces 214 of photoresist 204. In some embodiments, the width W of gaps 218 may be between about 0.25 µm and about 2 µm. The gaps 218 must be sufficiently wide, given the aspect ratio of the gaps, for the electrodeposition tool employed to ensure the electrolyte used in the process will reach the bottom of the gaps 218. Stated another way, the etching recesses the photoresist 204 with respect to the conductive traces 208.

Figure 2E:
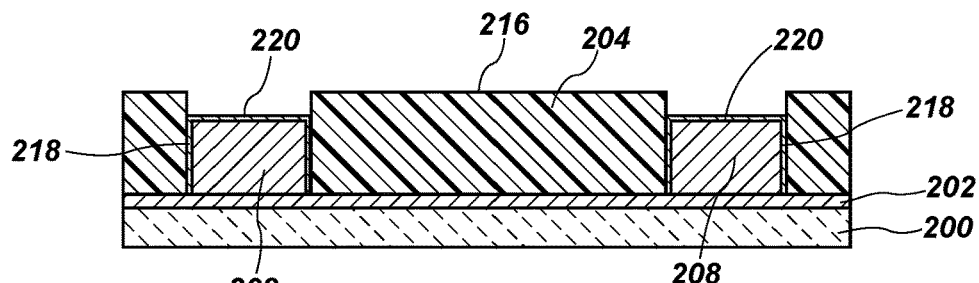

Referring to FIG. 2E, another metal, for example, nickel or gold, is deposited in gaps 218 and over upper surfaces 212 of conductive traces 208 to form etch barrier 220 over side surfaces 210 and upper surfaces 212 of conductive traces 208, etch barrier 220 extending downward to seed material 202. Other suitable materials for etch barrier 220 include, for example, tantalum, cobalt, indium, TiN, vanadium and combinations of any of the foregoing. The primary criteria for materials suitable for barrier 220 is the selectivity of etchants used to remove seed material to those materials over the material of the barrier 220. In addition to protecting conductive traces 208 from etchants, etch barrier 220 may be used as a base for interconnect metallurgy. For example, gold or nickel may serve as a suitable metallurgy for subsequent formation of an interconnect of compatible metal thereover, or formation of under bump metallization (UBM) for a solder ball. Alternatively, if desirable or required for metallurgical compatibility with an interconnect or external connection, upper surfaces 212 of conductive traces 208 may be selectively masked and another metal electroplated on barrier 220 at selected locations.

Figure 2F:
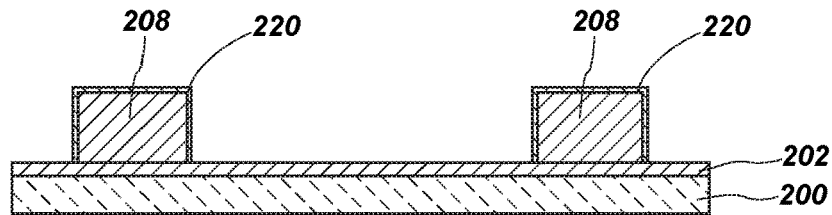

Referring to FIG. 2F, photoresist 204 may be stripped as is conventional to expose seed material 202 between conductive traces.

Figure 2G:
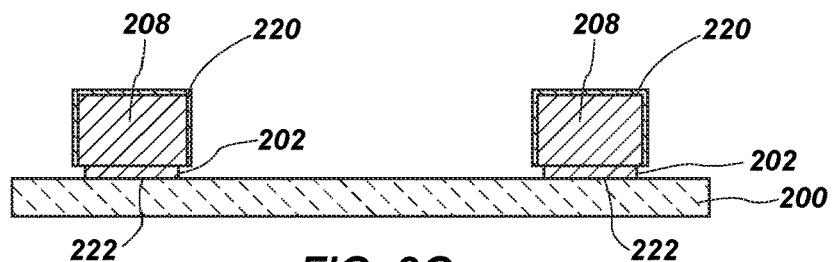

Referring to FIG. 2G, seed material 202 is then wet (chemically) etched between conductive traces 208 to electrically isolate conductive traces 208 from one another. The etchant employed is selective to the metal or metals of seed material 202 over the metal of etch barrier 220, which remains and protects the smooth side surfaces 210 and upper surface 212 of conductive traces 208, significantly reducing any adverse consequences of the above-noted skin effect and preserving signal transmission speed without the necessity of increasing power. If a bi-layer of copper and titanium, or another metal used for adherence to a substrate, is employed, different etchants, each selective respectively to copper and titanium (or other metal) over copper are employed. The underside 222 of traces 208 also presents a smooth surface, not having been etched. As shown in FIG. 2G, etching of seed material 202 may result in a slight undercut at the bottoms of side surfaces 210 below etch barrier 220; however, given the relatively thin seed material 202, the undercut (enlarged for clarity in the drawing figure) has no significant adverse effect on conductive traces 208 or the remaining segment of seed material 202 immediately thereunder.

Figure 3A:
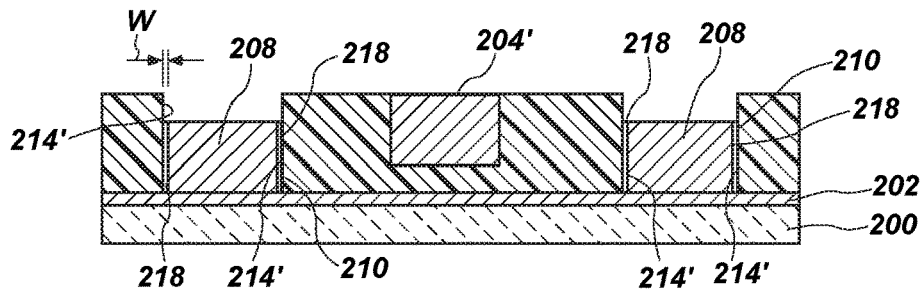
FIGS. 3A through 3D schematically depict a process flow according to other embodiments of the disclosure for fabrication of conductive traces on a substrate.

In another embodiment, the process flow is the same as that of the preceding embodiment in FIGS. 2A through 2C. However, following formation of conductive traces 208, photoresist 204 is stripped, and a second photoresist 204' may be deposited over substrate 200, patterned and developed as shown in FIG. 3A to provide gap 218 of suitable width W between side surfaces 210 of traces 208 and adjacent side surfaces 214' of the portions of photoresist 204' flanking each trace 208. Photoresist 204' may be the same type (positive or negative) as photoresist 204, and of the same or different composition.

Figure 3B:
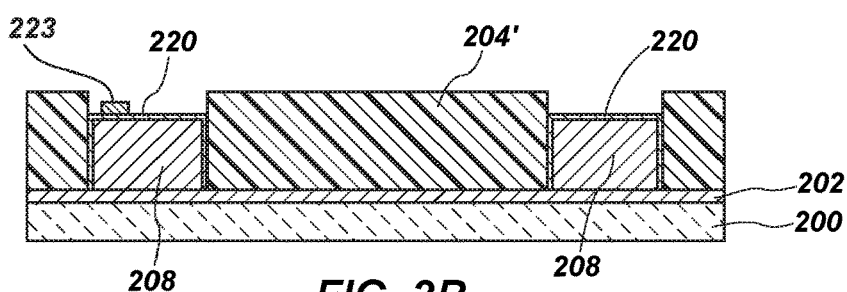

As shown in FIG. 3B, another metal, for example, nickel or gold, is deposited in gap 218 and over upper surfaces 212 of conductive traces 208 to form etch barrier 220 over side surfaces 210 and upper surfaces 212 of conductive traces 208, etch barrier 220 extending to downward to seed material 202. Other suitable materials for etch barrier 220 include, for example, tantalum, cobalt, indium, TiN, vanadium and combinations of any of the foregoing. As noted, previously, in addition to protecting conductive traces 208 from etchants, etch barrier 220 may be used as a base for interconnect or other electrical connection structure metallurgy. For example, gold or nickel may serve as a suitable metallurgy for subsequent formation of an interconnect of compatible metal thereover, or formation of under bump metallization (UBM) for a solder ball. Alternatively, if desirable or required for metallurgical compatibility with an interconnect or external connection, upper surfaces 212 of conductive traces 208 may be selectively masked and another metal (e.g., another metal 223) electroplated on barrier 220 at selected locations. For brevity and clarity, the another metal (e.g., another metal 223) is depicted only in FIG. 3B.

Figure 3C:
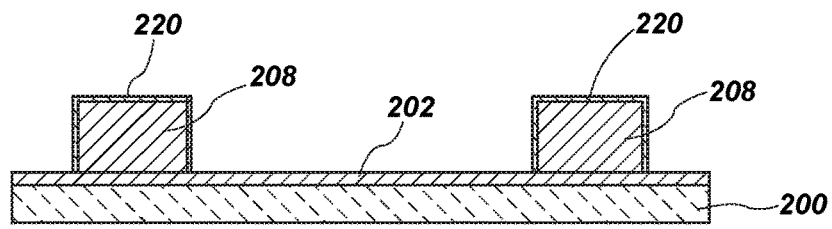

As shown in FIG. 3C, photoresist 204' may be stripped as is conventional to expose seed material 202 between conductive traces 208.

Figure 3D:
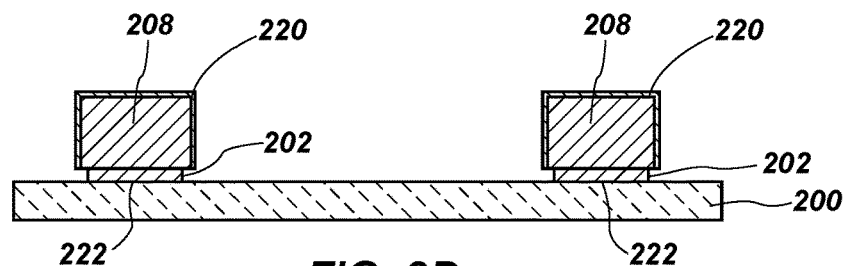

As shown in FIG. 3D, seed material 202 is then wet etched between conductive traces 208 to electrically isolate conductive traces 208 from one another. The etchant employed is selective to the metal or metals of seed material 202 over the metal of etch barrier 220, which remains and protects the smooth side surfaces 210 and upper surface 212 of conductive traces 208, significantly reducing any adverse consequences of the above-noted skin effect and preserving signal transmission speed without the necessity of increasing power. The underside 222 of traces 208 also presents a smooth surface, not having been etched. As shown in FIG. 3D, etching of seed material 202 may result in a slight undercut at the bottoms of side surfaces 210 below etch barrier 220; however, given the relatively thin seed material 202, the undercut (enlarged for clarity in the drawing figure) has no significant adverse effect on conductive traces 208 or the remaining segment of seed material 202 immediately thereunder.

Figure 4A:
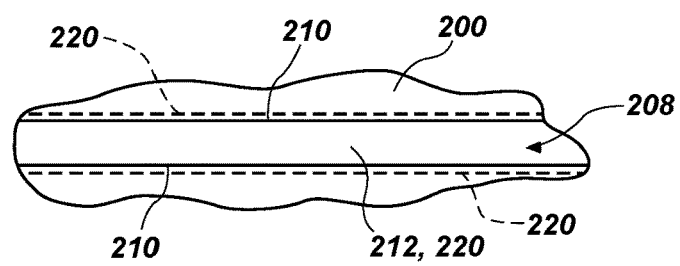
FIG. 4A is a schematic top elevation of a conductive trace formed according to embodiments of the disclosure.

FIG. 4A is a schematic top elevation of a portion of a conductive trace 208 formed on a substrate 200 according to embodiments of the disclosure. Etch barrier 220 on side surfaces 210 of conductive trace is depicted in broken lines, barrier 220 covering upper surface 212 as well.

Figure 4B:
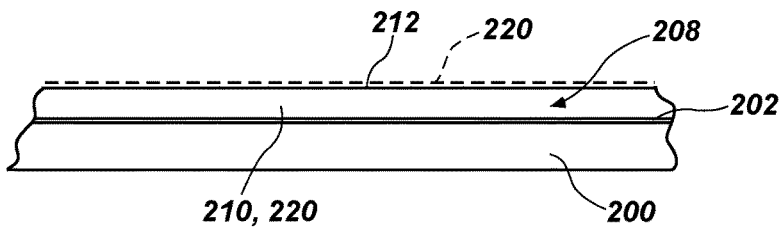
FIG. 4B is a schematic side elevation of a conductive trace formed according to embodiments of the disclosure.

FIG. 4B is a schematic side elevation of a portion of a conductive trace 208 formed on a substrate 200 according to embodiments of the disclosure. Barrier 220 on upper surface 212 of conductive trace 208 is depicted in broken lines, barrier 220 covering side surfaces 210 (one shown) as well.

Figure 4C:
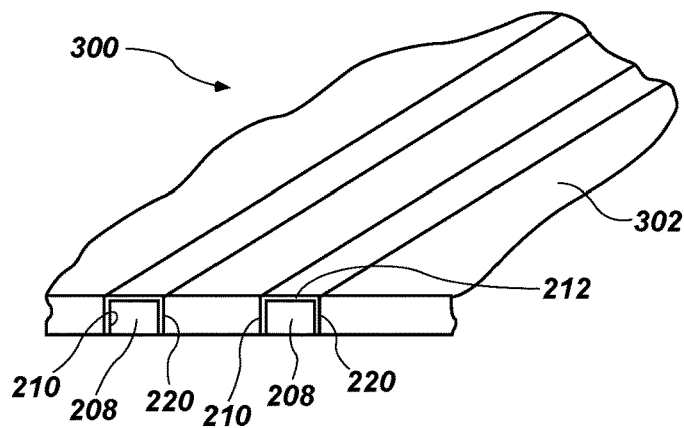
FIG. 4C is a schematic perspective of conductive traces of a level of an RDL formed according to embodiments of the disclosure.

FIG. 4C is a schematic perspective of conductive traces 208 of an RDL 300, traces 208 being mutually electrically isolated by a dielectric material 302, for example, a polyimide. Barrier 220 covers side surfaces 210 and upper surfaces 212 of traces 208.

Figure 4D:
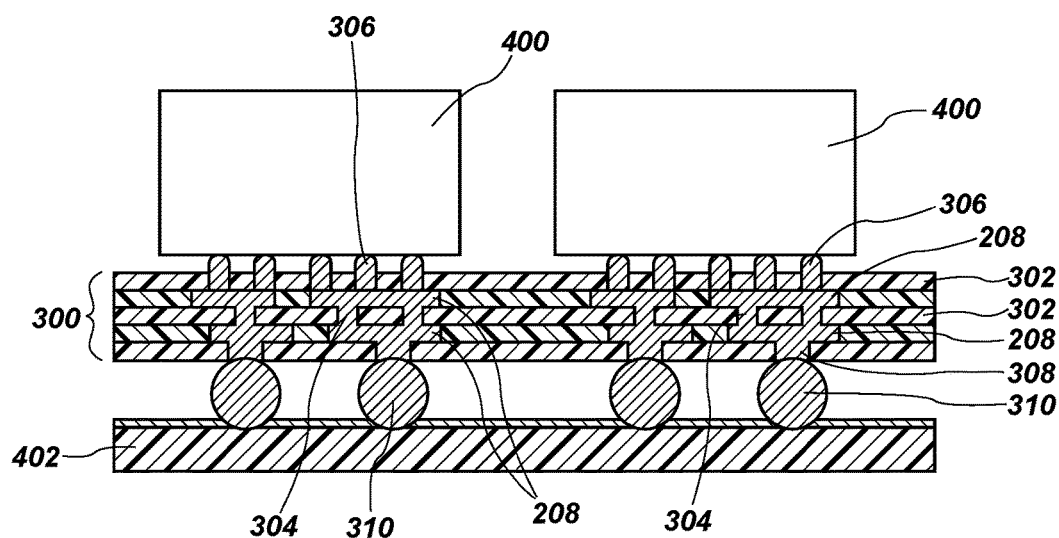
FIG. 4D is a side schematic partial sectional elevation of an RDL including multiple levels of conductive traces formed according to embodiments of the disclosure.

FIG. 4D is a schematic side elevation of a structure including an RDL 300 including multiple levels of conductive traces 208 according to embodiments of the disclosure, each conductive trace having side surfaces and upper surfaces covered by a barrier. Traces 208 are mutually electrically isolated by dielectric material 302, various traces levels are electrically connected by interconnects 304, other interconnects 306 are positioned for connections to semiconductor dice 400 on one side of RDL 300, and yet other interconnects comprise UBMs 308 having conductive elements in the form of solder bumps 310 disposed thereon for connection of semiconductor dice 400 to higher-level packaging 402.

Embodiments of the disclosure include a method of forming conductive traces, comprising forming a seed material over a surface of a substrate, forming a patterned mask material over the seed material to define trenches, leaving portions of the seed material within the trenches exposed, depositing a conductive material over the exposed seed material in the trenches to form conductive traces, removing at least a portion of the patterned mask material, forming a barrier over side surfaces and upper surfaces of the conductive traces, and removing exposed portions of the seed material.

Embodiments of the disclosure also include a method of forming a copper seed material over a surface of a substrate, forming and patterning positive photoresist material over the copper seed material to define trenches extending to the copper seed material, electrochemically depositing copper over the exposed copper seed material in the trenches to form conductive traces, etching the patterned positive photoresist material to remove a depth of the photoresist material from at least side surfaces of the photoresist material adjacent side surfaces of the conductive traces to recess the photoresist material with respect to side surfaces of the conductive traces, electrochemically depositing a metal barrier between the side surfaces of the photoresist material and the adjacent side surfaces of the conductive traces, and over upper surfaces of the conductive traces, stripping remaining positive photoresist material to expose portions of the seed material, and etching the exposed portions of the seed material.

Embodiments of the disclosure further include a structure, comprising conductive traces mutually electrically isolated by a dielectric material, wherein the conductive traces are configured with a rectangular cross-section, comprise a copper core, and side surfaces of the copper core and a surface of the copper core extending between the side surfaces are covered with a metal barrier.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming conductive traces, the method comprising:
    forming a seed material extending over a portion of a planar surface of a substrate;
    forming a patterned mask material over the seed material to define trenches leaving portions of the seed material within the trenches exposed;
    depositing a conductive material over the exposed seed material in the trenches to form conductive traces;
    removing at least a portion of the patterned mask material;
    forming a barrier over side surfaces and upper surfaces of the conductive traces;
    after forming the barrier, removing a remaining portion of the patterned mask material; and
    removing exposed portions of the seed material.

2. The method of claim 1, wherein:
    removing at least a portion of the patterned mask material comprises removing a depth of the patterned mask material at least from side surfaces of the patterned mask material adjacent side surfaces of the conductive traces to form gaps between the patterned mask material and the conductive traces; and
    forming a barrier comprises forming a barrier in the gaps adjacent the side surfaces and over upper surfaces of the conductive traces.

3. The method of claim 1, wherein forming a seed material over a surface of a substrate comprises forming at least a portion of the seed material of copper by physical vapor deposition.

4. The method of claim 3, wherein depositing a conductive material over the exposed seed material in the trenches to form conductive traces comprises electroplating copper in the trenches.

5. The method of claim 4, wherein electroplating copper in the trenches comprises forming the conductive traces to exhibit a topography variation of the side surfaces and the upper surfaces of no more than about 2 nanometers (nm) RMS.

6. The method of claim 5, wherein forming a barrier over side surfaces and upper surfaces of the conductive traces comprises electroplating nickel, gold, tantalum, cobalt, indium, TiN, vanadium or a combination thereof over the side surfaces and upper surfaces.

7. The method of claim 6, further comprising electroplating another metal over only a portion of at least one of the upper surfaces of the conductive traces.

8. The method of claim 3, wherein forming a seed material further comprises forming titanium by physical vapor deposition before forming the at least a portion of the seed material of copper thereover.

9. The method of claim 1, wherein forming and patterning a mask material over the seed material comprises forming and patterning a photoresist material.

10. The method of claim 1, wherein removing exposed portions of the seed material comprises etching the exposed portions of the seed material with one or more etchants selective to one or more materials of the seed material over a material of the barrier.

11. A method of forming conductive traces, the method comprising:
    forming a seed material extending over a portion of a planar surface of a substrate;
    forming a patterned mask material over the seed material to define trenches leaving portions of the seed material within the trenches exposed;

depositing a conductive material over the exposed seed material in the trenches to form conductive traces;

removing all of the patterned mask material;

forming and patterning another mask material over the seed material to leave gaps between side surfaces of the other mask material adjacent side surfaces of the conductive traces;

forming a barrier in the gaps adjacent the side surfaces and over upper surfaces of the conductive traces to completely fill the gaps; and after forming the barrier, removing the patterned other mask material before removing exposed portions of the seed material.

12. The method of claim 11, wherein the mask material and the other mask material are of the same composition.

13. A method of forming conductive traces, the method comprising:

forming a copper seed material over a surface of a substrate;

forming and patterning positive photoresist material over the copper seed material to define trenches extending to the copper seed material;

electrochemically depositing copper over the exposed copper seed material in the trenches to form conductive traces;

etching the patterned positive photoresist material to remove a depth of the positive photoresist material from at least side surfaces of the positive photoresist material adjacent side surfaces of the conductive traces to recess the positive photoresist material with respect to side surfaces of the conductive traces;

electrochemically depositing a metal barrier between the side surfaces of the photoresist material and the adjacent side surfaces of the conductive traces, and over upper surfaces of the conductive traces;

stripping remaining positive photoresist material to expose portions of the copper seed material; and etching the exposed portions of the copper seed material.

14. The method of claim 13, wherein electrochemically depositing a metal barrier comprises electrochemically depositing nickel, gold, tantalum, cobalt, indium, TiN, vanadium or a combination thereof.

15. The method of claim 13, wherein etching the patterned positive photoresist material comprises reactive ion etching.

16. The method of claim 13, wherein electrochemically depositing copper in the trenches comprises forming the conductive traces to exhibit a topography variation of the side surfaces and the upper surfaces of no more than about 2 nanometers (nm) RMS.

17. A structure, comprising:

conductive traces on a seed material;

wherein the conductive traces are configured with a rectangular cross-section, comprise a copper core, and side surfaces of the copper core and a first surface of the copper core extending between the side surfaces are covered with a metal barrier, wherein the metal barrier extending along the side surfaces of the copper core stops at a second surface of the copper core extending between the side surfaces and opposite the first surface.

18. The structure of claim 17, wherein the metal barrier comprises nickel, gold, tantalum, cobalt, indium, TiN, vanadium or a combination thereof.

19. The structure of claim 17, wherein at least some surfaces of the copper core exhibit a topography variation of no more than about 2 nanometers (nm) RMS.

20. The structure of claim 17, wherein the conductive traces and a dielectric material comprise a redistribution layer (RDL), and further comprising at least one semiconductor die electrically connected to at least some of the conductive traces on one side of the RDL.

21. The structure of claim 20, further comprising conductive elements electrically connected to at least some of the conductive traces on a side of the RDL opposite the at least one semiconductor die.

22. The structure of claim 17, wherein a lateral width of the seed material is less than a lateral width of the copper core.

* * * * *